(12) United States Patent
Kim et al.

(10) Patent No.: US 9,443,732 B1
(45) Date of Patent: Sep. 13, 2016

(54) METHOD OF FABRICATING SEMICONDUCTOR DEVICE

(71) Applicant: Samsung Electronics Co., Ltd., Suwon-Si, Gyeonggi-Do (KR)

(72) Inventors: Tae Sun Kim, Hwaseong-si (KR); Jaekyung Seo, Yongin-si (KR); Kwangsub Yoon, Yongin-si (KR); Yura Kim, Seoul (KR); Yeojin Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1 day.

(21) Appl. No.: 14/452,243

(22) Filed: Aug. 5, 2014

(51) Int. Cl.
*G03F 7/40* (2006.01)
*H01L 21/426* (2006.01)
*H01L 21/266* (2006.01)
*H01L 29/66* (2006.01)
*H01L 21/02* (2006.01)

(52) U.S. Cl.
CPC ......... *H01L 21/266* (2013.01); *H01L 21/0262* (2013.01); *H01L 29/66795* (2013.01)

(58) Field of Classification Search
None
See application file for complete search history.

(56) References Cited

U.S. PATENT DOCUMENTS

| | | | |
|---|---|---|---|
| 6,319,853 B1 * | 11/2001 | Ishibashi et al. | 438/780 |
| 7,052,617 B2 | 5/2006 | Huang et al. | |
| 7,172,974 B2 | 2/2007 | Choi et al. | |
| 7,494,919 B2 | 2/2009 | Brodsky et al. | |
| 2004/0004057 A1 | 1/2004 | Huang et al. | |
| 2004/0082170 A1 | 4/2004 | Choi et al. | |
| 2006/0154412 A1 * | 7/2006 | Brodsky et al. | 438/197 |
| 2006/0246382 A1 | 11/2006 | Lee et al. | |
| 2007/0010091 A1 * | 1/2007 | Bailey | H01L 21/0273 438/637 |
| 2008/0001234 A1 * | 1/2008 | Cheng et al. | 257/370 |

FOREIGN PATENT DOCUMENTS

| | | | |
|---|---|---|---|
| JP | 2000173996 A | 6/2000 | |
| JP | 3592805 B2 | 11/2004 | |
| KR | 20020002524 A | 1/2002 | |
| KR | 20040004909 A | 1/2004 | |
| KR | 100443346 B1 | 8/2004 | |
| KR | 100653977 B1 | 12/2006 | |

OTHER PUBLICATIONS

Shin-Wei Chang et al., "New Materials and Processes for Directed Self-Assembly", Proc. of SPIE vol. 8680 86800F, 1-9 pages, 2013.
Gerard Schmid et al.,"Fabrication of 28nm pitch Si fins with DSA lithography", Proc. of SPIE vol. 8680 86801F, 1-12 pages, 2013.

(Continued)

*Primary Examiner* — Pamela E Perkins
(74) *Attorney, Agent, or Firm* — Harness, Dickey & Pierce, P.L.C.

(57) ABSTRACT

The method may include forming a plurality of fins on a substrate with first and second regions, forming a photoresist pattern to expose the fins of the first region, forming a material layer to cover the fins of first region and the photoresist pattern, chemically reacting the photoresist pattern the material layer to form a supplemental film on a side surface of the photoresist pattern, performing an ion implantation process using the photoresist pattern and the supplemental film as a ion injection mask to form impurity layers in the fins of the first region.

18 Claims, 17 Drawing Sheets

(56) References Cited

OTHER PUBLICATIONS

Benjamen Rathsack et al., "Advances in Directed Self Assembly Integration And Manufacturability at 300 mm", Proc. of SPIE vol. 8682 86820K, 1-11 pages, 2013.

Jaewoo Nam et al., "Patterning process for semiconductor using Directed Self-Assembly", Proc. of SPIE vol. 8680 868011, 1-6 pages, 2013.

* cited by examiner

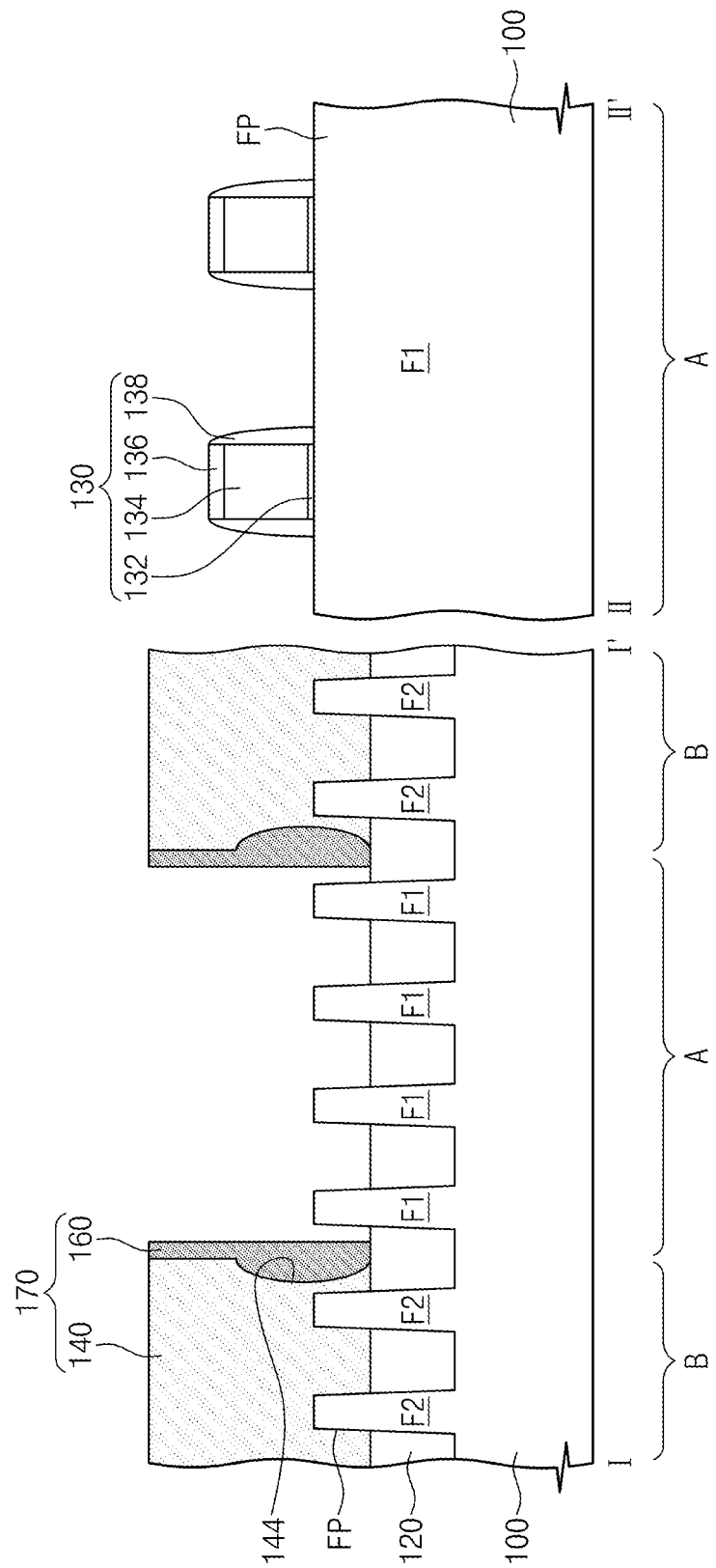

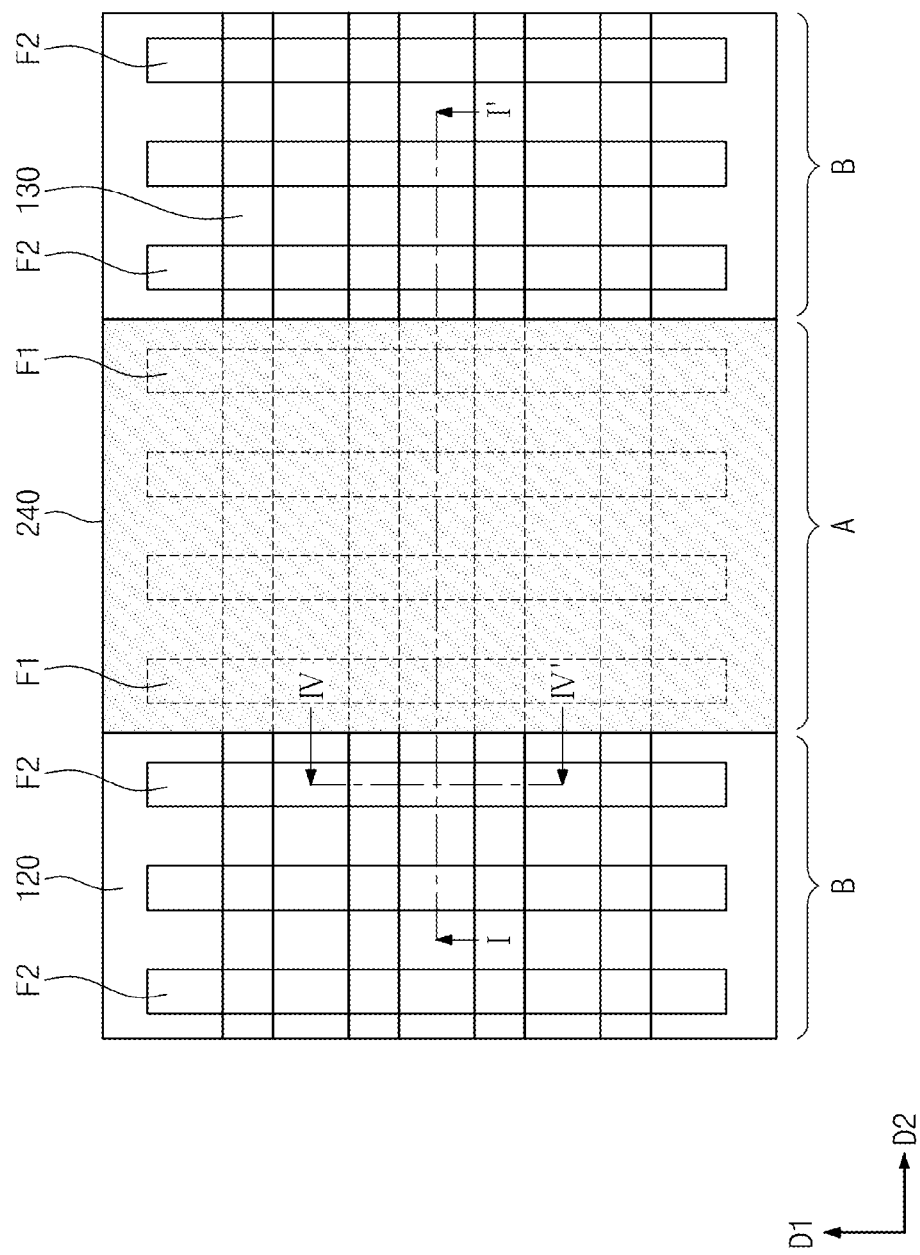

METHOD OF FABRICATING SEMICONDUCTOR DEVICE

BACKGROUND

Example embodiments of the inventive concepts relate to a method of fabricating a semiconductor device, and in particular, to a method of fabricating a semiconductor device with a three-dimensional channel.

A FinFET has been proposed as one of the semiconductor devices with a three-dimensional channel. In the FinFET, a fin-shaped silicon body is formed on a substrate and a gate electrode is formed on the silicon body. Since the FinFET has a three-dimensional channel, it can be easily scaled down. Further, the FinFET exhibits improved current controllability, when compared with a conventional planar transistor with the same gate length.

SUMMARY

Example embodiments of the inventive concepts provide a method of reliably injecting impurities into fins and a highly reliable semiconductor device fabricated thereby.

Other example embodiments of the inventive concepts provide a method of improving a profile of a photoresist pattern serving as an ion injection mask and of preventing a process failure from occurring, when an ion implantation process is performed to fabricate a semiconductor device.

According to example embodiments of the inventive concepts, a method of fabricating a semiconductor device may include providing a substrate with a first region and a second region, forming a photoresist pattern on the substrate to expose the first region of the substrate, forming a material layer on the substrate to cover the photoresist pattern and the first region of the substrate, forming a supplemental film on a side surface of the photoresist pattern, the supplemental film being formed by a chemical reaction between the photoresist pattern and the material layer, and injecting impurity ions into the first region of the substrate using the photoresist pattern and the supplemental film as an ion injection mask to form impurity layers in the substrate.

In example embodiments, the photoresist pattern may be formed to have an undercut region positioned on a lower portion of the side surface.

In example embodiments, the material layer may be formed of a material containing a water-soluble polymer and a water-soluble crosslinking agent.

In example embodiments, the forming of the supplemental film may include chemically reacting the photoresist pattern with a portion of the material layer in contact with the side surface of the photoresist pattern to form the supplemental film, and removing an unreacted portion of the material layer to expose the first region of the substrate.

In example embodiments, the supplemental film may be formed by performing a baking process on the photoresist pattern and the material layer at temperature ranging from about 100° C. to about 150° C.

In example embodiments, the supplemental film may be formed to be thicker on the undercut region than on an upper side surface of the photoresist pattern.

In example embodiments, the method may further include forming first and second fins on the first and second regions, respectively, of the substrate.

In example embodiments, the method may further include forming gate structures to cross the first and second fins.

In example embodiments, the forming of the impurity layers may include injecting impurity ions into the first fins of the first region to form first impurity layers, which are positioned adjacent to both sides of each of the gate structures to serve as halo regions.

According to example embodiments of the inventive concepts, a method of fabricating a semiconductor device may include providing a substrate with fins, forming a photoresist pattern on the substrate, the photoresist pattern having an undercut region formed on a lower side portion of a side surface, forming a material layer to cover the side surface and a top surfaces of the photoresist pattern, forming a supplemental film on the side surface of the photoresist pattern to fill at least a portion of the undercut region, the supplemental film being formed by chemically reacting the photoresist pattern with a portion of the material layer in contact with the side surface of the photoresist pattern, and injecting impurity ions into the fins using the photoresist pattern and the supplemental film as an ion injection mask to form impurity layers in the fins, respectively.

In example embodiments, the fins may be formed to protrude upward from the substrate.

In example embodiments, the forming of the supplemental film further may include removing an unreacted portion of the material layer, after the forming of the supplemental film.

In example embodiments, the supplemental film may be formed by performing a baking process on the photoresist pattern and the material layer at temperature ranging from about 100° C. to about 150° C.

In example embodiments, the impurity layers may be formed to serve as halo regions.

According to example embodiments of the inventive concepts, a method of fabricating a semiconductor device may include providing a substrate with a first region and a second region, forming first and second fins on the first and second regions, respectively, of the substrate, forming a first photoresist pattern on the substrate to expose the first fins of the first region, forming a first material layer on the substrate to cover the first photoresist pattern and the first fins of the first region, chemically reacting the first photoresist pattern with a portion of the first material layer to form a first supplemental film on a side surface of the first photoresist pattern, removing an unreacted portion of the first material layer, and injecting impurity ions into the first fins of the first region using the first supplemental film and the first photoresist pattern as a first ion injection mask pattern to form first impurity layers in the first fins, respectively.

In example embodiments, the method may further include removing the first ion injection mask, forming a second photoresist pattern on the substrate to expose the second fins, forming a second material layer on the substrate to cover the second photoresist pattern and the second fins of the second region, chemically reacting the second photoresist pattern with a portion of the second material layer to form a second supplemental film on a side surface of the second photoresist pattern, removing an unreacted portion of the second material layer, and injecting impurity ions into the second fins of the second region using the second supplemental film and the second photoresist pattern as a second ion injection mask pattern to form second impurity layers in the second fins, respectively.

In example embodiments, each of the first and second photoresist patterns may be formed to have an undercut region positioned on a lower portion of the side surface.

In example embodiments, the chemically reacting the first photoresist pattern with a portion of the first material layer may occur by performing a baking process on the first photoresist pattern and the first material layer at temperature ranging from about 100° C. to about 150° C., and the chemically reacting the second photoresist pattern with a portion of the second material layer may occur by performing a baking process on the second photoresist pattern and the second material layer at temperature ranging from about 100° C. to about 150° C.

In example embodiments, the method may further include forming gate structures to cross the first and second fins.

In example embodiments, the first and second impurity layers may be formed adjacent to both sides of each of the gate structures to serve as halo regions.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 2A through 5A are plan views illustrating some steps of a process for fabricating a semiconductor device, according to some example embodiments of the inventive concepts.

FIGS. 2B, 3B, 3C, 4B through 4E, and 5B through 5E are sectional views illustrating some steps of a process for fabricating a semiconductor device, according to some example embodiments of the inventive concepts.

Figure 1:
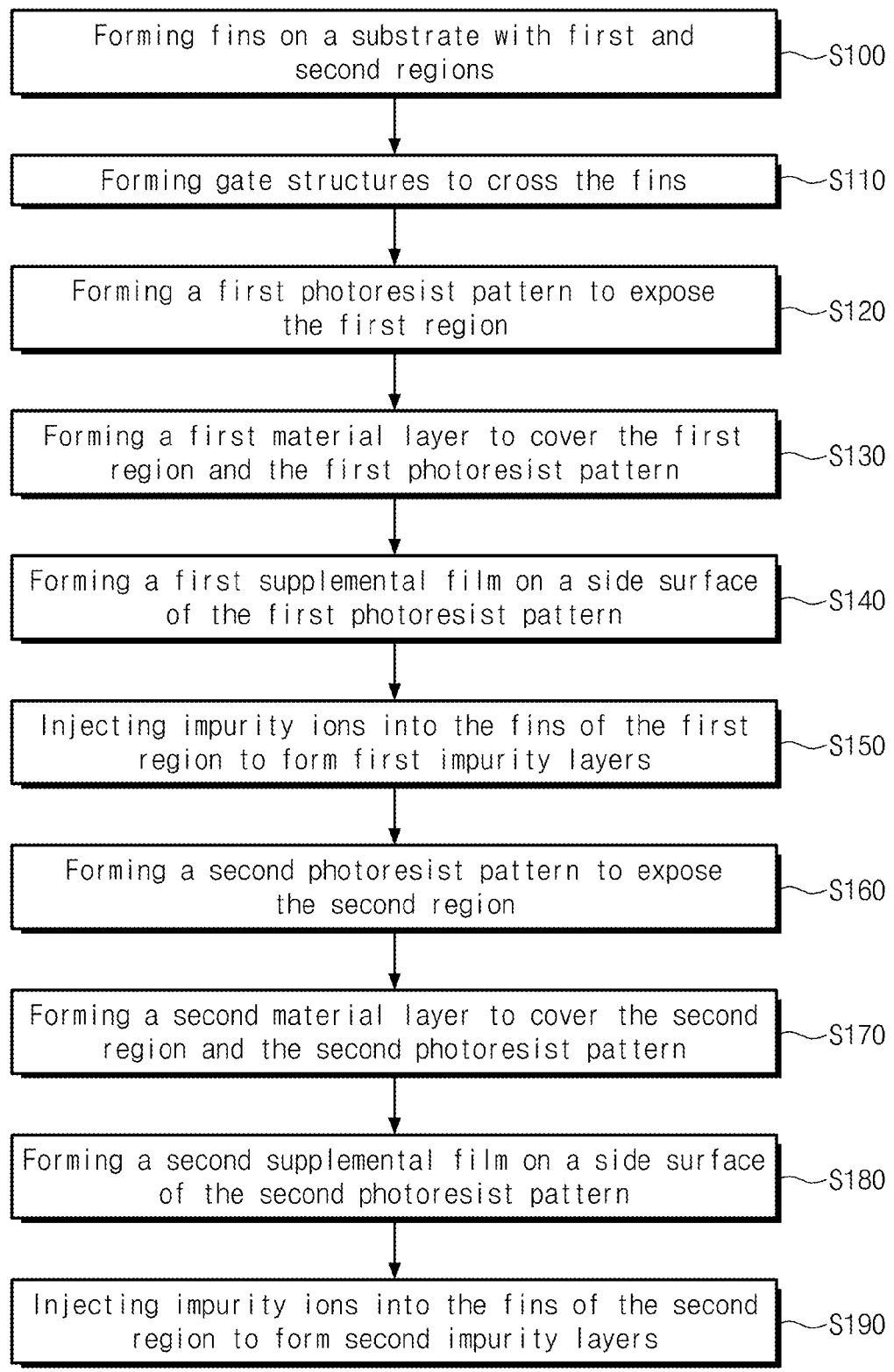
FIG. 1 is a flow chart illustrating a method of fabricating a semiconductor device, according to some example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2A:
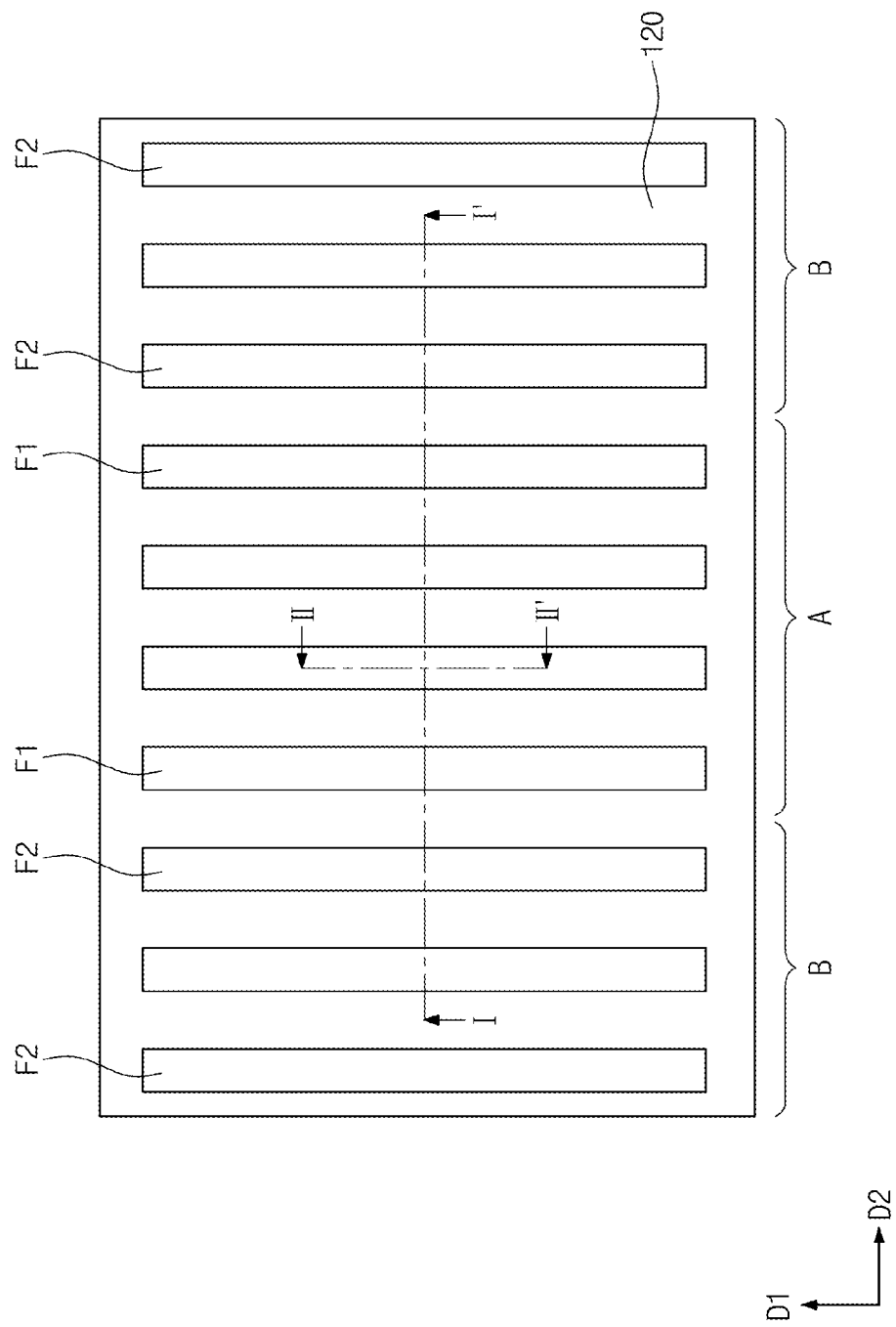
Figure 2B:
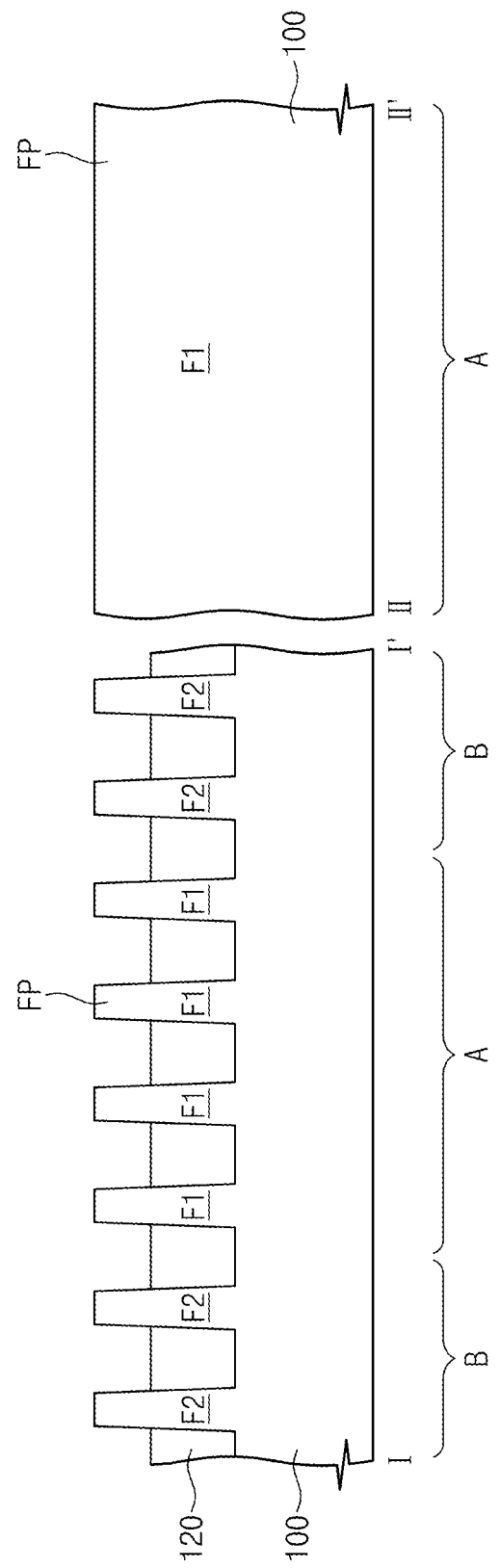
Figure 3A:
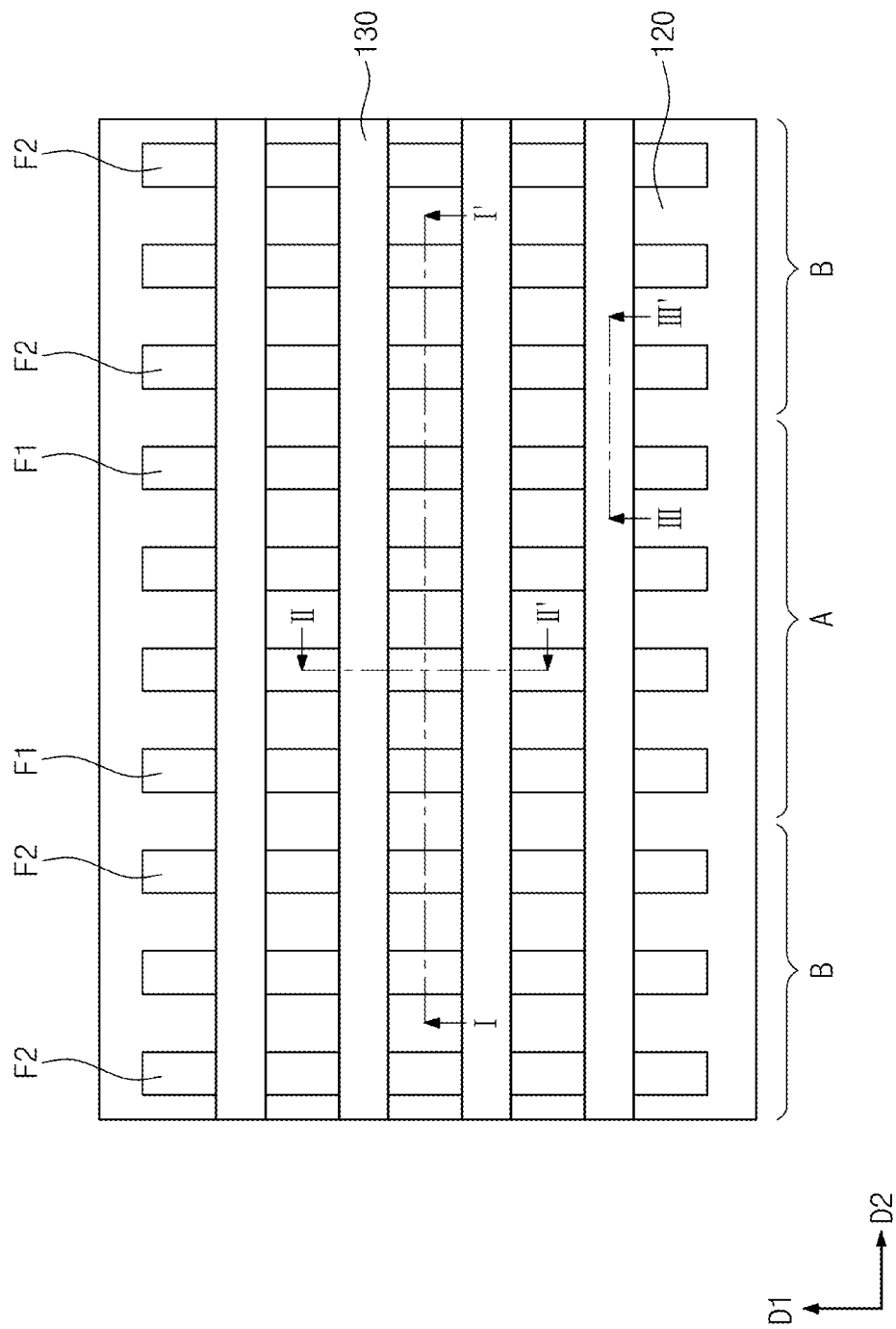
Figure 3B:
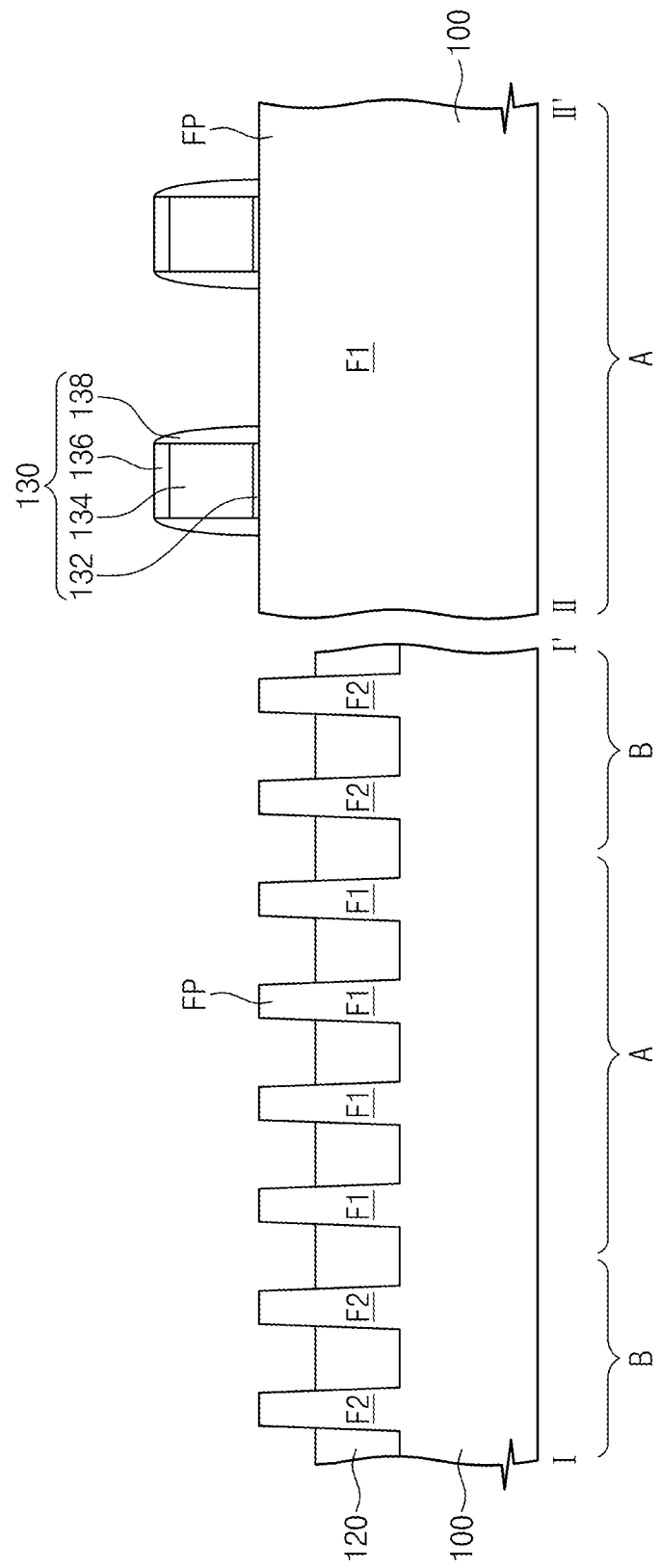
Figure 3C:
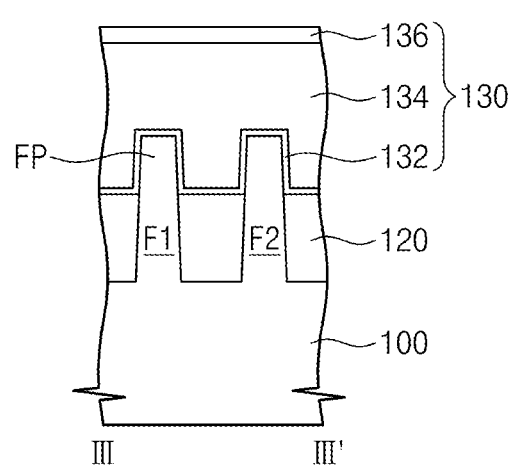

FIG. 1 is a flow chart illustrating a method of fabricating a semiconductor device, according to some example embodiments of the inventive concepts, FIGS. 2A through 5A are plan views illustrating some steps of a process for fabricating a semiconductor device, according to some example embodiments of the inventive concepts, and each of FIGS. 2B, 3B, 3C, 4B through 4E, and 5B through 5E is a sectional view illustrating a portion of a corresponding one of FIGS. 2A through 5A. In detail, FIG. 2B is a sectional view taken along lines I-I' and II-II' of FIG. 2A, FIG. 3B is a sectional view taken along lines I-I' and II-II' of FIG. 3A, FIG. 3B is a sectional view taken along line III-III' of FIG. 3A, FIGS. 4B through 4E are sectional views corresponding to lines I-I' and II-II' of FIG. 4A, and FIGS. 5B through 5E are sectional views corresponding to lines I-I' and IV-IV' of FIG. 5A.

Referring to FIGS. 1, 2A, and 2B, a plurality of fins F1 and F2 may be formed on a substrate 100 with a first region A and a second region B (in S100).

In detail, the substrate 100 may include the first region A and the second region B. The first fins F1 may be formed on the first region A of the substrate 100, and the second fins F2 may be formed on the second region B of the substrate 100. In example embodiments, the first and second fins F1 and F2 may be formed by etching the substrate 100. The first and second fins F1 and F2 may extend parallel to a first direction D1 and may be formed spaced apart from each other in a second direction D2. The first and second fins F1 and F2 may be formed to protrude upward from the substrate 100. The first and second directions D1 and D2 may cross each other. For example, the first and second directions D1 and D2 may be orthogonal to each other, but example embodiments of the inventive concepts may not be limited thereto. The substrate 100 may be a semiconductor substrate including a semiconductor material. For example, the substrate 100 may be formed of or include a semiconductor layer made of at least one of Si, Ge, SiGe, GaP, GaAs, SiC, SiGeC, InAs, or InP. An insulating isolation layer 120 may be formed between the first and second fins F1 and F2. The insulating isolation layer 120 may be formed to include a plurality of portions, each of which extends parallel to the first direction D1. For example, the first and second fins F1 and F2 may have side surfaces that are in contact with the insulating isolation layer 120. Each of the first and second fins F1 and F2 may include a pillar region FP protruding upward from the insulating isolation layer 120. The insulating isolation layer 120 may be formed of or include oxide, nitride, and/or oxynitride.

Each of the first and second fins F1 and F2 may serve as an active and/or channel region of a semiconductor device such as a FinFET. For example, each of the first fins F1 on the first region A may be used to realize a semiconductor device of a first conductivity type, and each of the second fins F2 on the second region B may be used to realize a semiconductor device of a second conductivity type. In other words, the first region A is a region in which the semiconductor devices of the first conductivity type will be formed, and the second region B is a region in which the semiconductor devices of the second conductivity type will be formed. In example embodiments, the semiconductor device of the first conductivity type may be a p-type semiconductor device (e.g., a PMOS transistor), and the semiconductor device of the second conductivity type may be an n-type semiconductor device (e.g., an NMOS transistor).

Referring to FIGS. 1 and 3A through 3B, gate structures 130 may be formed to cross the plurality of fins F1 and F2 (in S110).

Each of the gate structures 130 may be formed to extend parallel to the second direction D2 and cross the first and second fins F1 and F2. Further, the gate structures 130 may be formed spaced apart from each other in the first direction D1. The gate structures 130 may be formed to cover side and top surfaces of the pillar regions FP of the first and second fins F1 and F2. Since the gate structures 130 extend parallel to the second direction D2, the gate structures 130 may cross and cover the portions of the insulating isolation layer 120 positioned between the first and second fins F1 and F2.

Each of the gate structures 130 may include a gate insulating layer 132, a gate electrode 134, and a gate capping layer 136, which are sequentially stacked on the substrate 100. The gate structures 130 may be formed using deposition and patterning processes. In some embodiments, each of the gate structures 130 may further include gate spacers 138 formed on side surfaces of the gate electrode 134 and the gate capping layer 136. In example embodiments, the gate structures 130 may be used as sacrificial gate structures. For example, the gate insulating layer 132, the gate electrode 134, and the gate capping layer 136 of the gate structures 130 may be removed in a subsequent process, and a normal gate insulating layer and a normal gate electrode may be formed in place of each of the gate structures 130. The gate electrode 134 may be formed of or include, for example, at least one of silicon (e.g., polycrystalline silicon or amorphous silicon) or metals (e.g., tungsten, aluminum, titanium, or tantalum). The gate insulating layer 132 may be formed of or include, for example, at least one of oxide or/and high-k dielectric materials. The gate capping layer 136 and the gate spacer 138 may be formed of or include silicon nitride or silicon oxynitride.

Figure 4A:
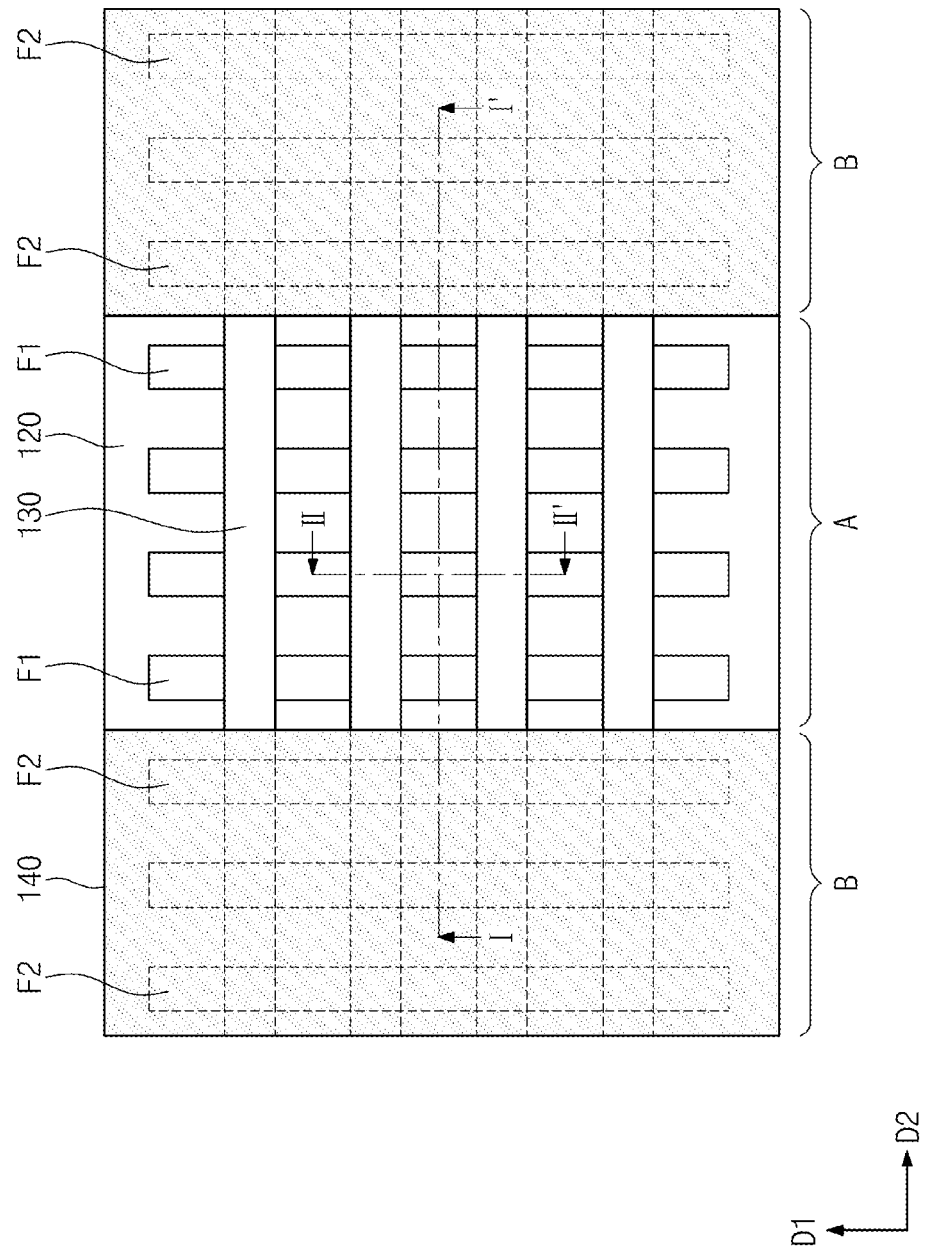
Figure 4B:
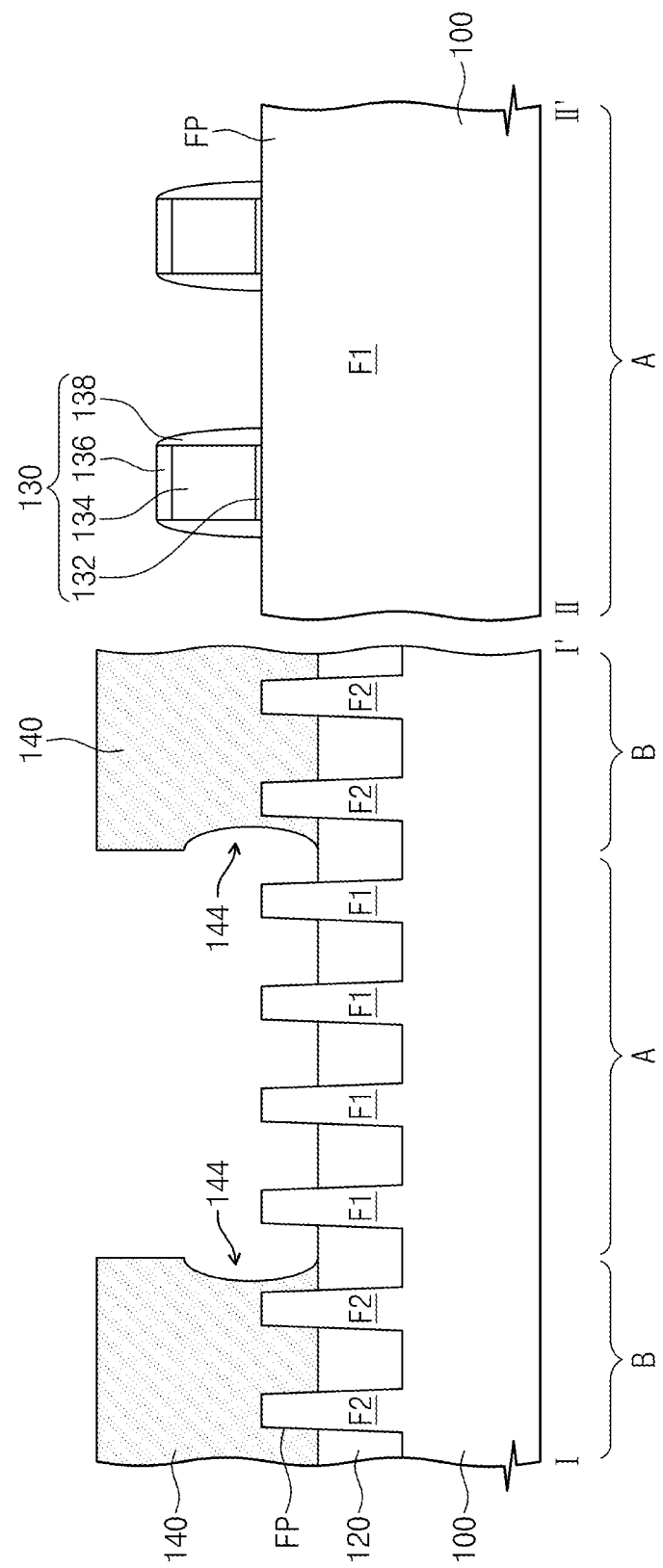

Referring to FIGS. 1, 4A, and 4B, a first photoresist pattern 140 may be formed to expose the first region A of the substrate 100 (in S120).

The first photoresist pattern 140 may be formed to cover the second region B of the substrate 100 and expose the first fins F1 on the first region A and the gate structures 130 crossing the first fins F1 and the insulating isolation layer 120. The formation of the first photoresist pattern 140 may include forming a photoresist layer to cover the whole top surface of the substrate 100 provided with the gate structures 130, exposing a portion of the photoresist layer positioned on the first region A to light, and then, developing the exposed photoresist layer. During the formation of the first photoresist pattern 140, an acid may be produced on a side surface of the first photoresist pattern 140.

The photoresist layer may include at least one of acetal-type copolymers, acrylate-type copolymers, environmentally stable chemical amplified photoresist (ESCAP)-type copolymers, cyclo olefin-maleic anhydride (COMA)-type copolymers, or hybrid-type copolymers containing the COMA- and acrylate-type copolymers. The exposing of the photoresist layer may be performed using KrF excimer laser, ArF excimer laser, extreme ultra violet (EUV) light, X-ray, or ion beam.

In the case where the exposing process is performed on the portion of the photoresist layer positioned on the first region A, light used in the exposing process may be scatteredly reflected by the first fins F1 on the substrate 100. As a result of the scattered reflection, a first undercut region 144 may be formed on a lower side surface of the first photoresist pattern 140. In other words, since the first and second fins F1 and F2 are formed on the substrate 100, the substrate 100 may have a non-flat topography, resulting in a difficulty in realizing a desired profile of the photoresist pattern. Accordingly, in a subsequent process, the second fins F2 of the second region B covered with the first photoresist pattern 140 may suffer from an unintended effect. For example, the second fins F2 of the second region B adjacent to the first undercut region 144 may be unintentionally doped with impurities, when the first fins F1 of the first region A are doped by an ion implantation process using the first photoresist pattern 140 as a mask. In other words, the presence of the first undercut region 144 may lead to a reduction in distance from the side surface of the first photoresist pattern 140 to the second fins F2, and thus, impurities for doping the first fins F1 may be unintentionally injected into the second fins F2. The unintended doping of the second fins F2 may lead to deterioration in electric characteristics or reliability of a semiconductor device (e.g., of the second conductivity type), which will be formed on the second fins F2 of the second region B.

Figure 4C:
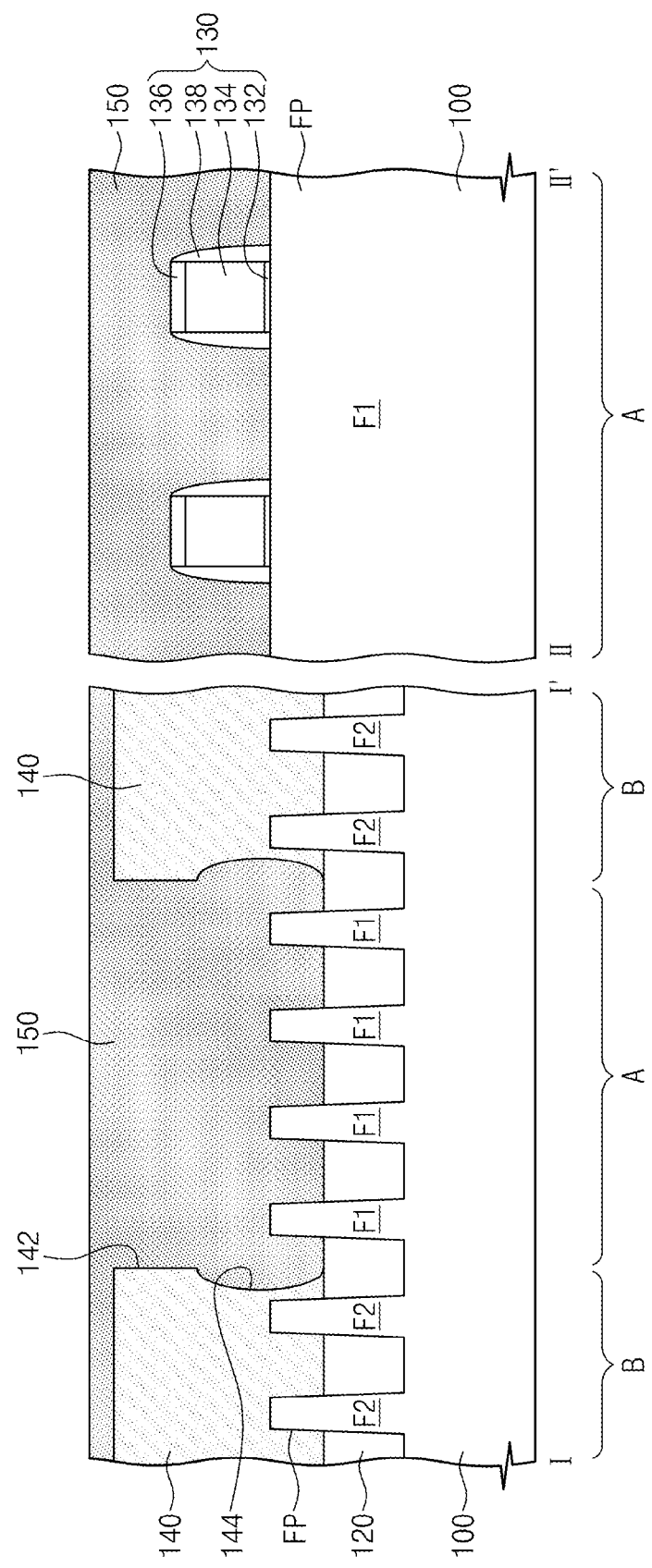

Referring to FIGS. 1, 4A, and 4C, a first material layer 150 may be formed to cover the first region A of the substrate 100 and the first photoresist pattern 140 (in S130).

The first material layer 150 may be formed on the first photoresist pattern 140 with the first undercut region 144 and the substrate 100 exposed by the first photoresist pattern 140. For example, the first material layer 150 may cover the first fins F1, the gate structures 130, and the insulating isolation layer 120, and the first photoresist pattern 140. The first material layer 150 may be formed using a spin coating process. In example embodiments, the first material layer 150 may be formed of a material containing a water-soluble polymer and a water-soluble crosslinking agent.

Referring to FIGS. 1, 4A, and 4D, a first supplemental film 160 may be formed on the side surface of the first photoresist pattern 140 (in S140).

The first material layer 150 and the first photoresist pattern 140 may be thermally treated by a baking process, which may be performed at temperature ranging from about 100° C. to about 150° C. During the baking process, a chemical reaction, such as inter-mixing or cross linking, may occur between the first photoresist pattern 140 and the first material layer 150 in contact with each other, and as a result of the chemical reaction, the first supplemental film 160 may be formed on the side surface of the first photoresist pattern 140. For example, the first supplemental film 160 may be produced by a chemical reaction between the acid and the water-soluble crosslinking agent containing material contained in the first photoresist pattern 140 and the first material layer 150, respectively. The side surface of the first photoresist pattern 140 with the first undercut region 144 may have a relatively large area, and thus, a large amount of the acid therein may be used for the chemical reaction with the water-soluble crosslinking agent containing material of the first material layer 150. Accordingly, the first supplemental film 160 may be formed to be thicker on the first undercut region 144 than on an upper side surface of the first photoresist pattern 140, and this makes it possible to improve uniformity of a sidewall profile of the first photoresist pattern 140. For example, the first supplemental film 160 may be formed to fill at least a portion of the first undercut region 144. Further, an outer side surface of the first supplemental film 160 facing the first region A may be formed to have a substantially uniform sidewall profile. A thickness of the first supplemental film 160 may be controlled by adjusting a process temperature and/or a duration time of the baking process.

Some portion of the first material layer 150 may not be transformed to the first supplemental film 160 and may be in an unreacted state. Such an unreacted portion of the first material layer 150 may be removed by, for example, a rinse process using deionized water. The first photoresist pattern 140 and the first supplemental film 160 may constitute a first ion injection mask 170 exposing the first region A of the substrate 100. For example, the first ion injection mask 170 may expose the first fins F1, the insulating isolation layer 120, and the gate structures 130 on the first region A.

Figure 4E:
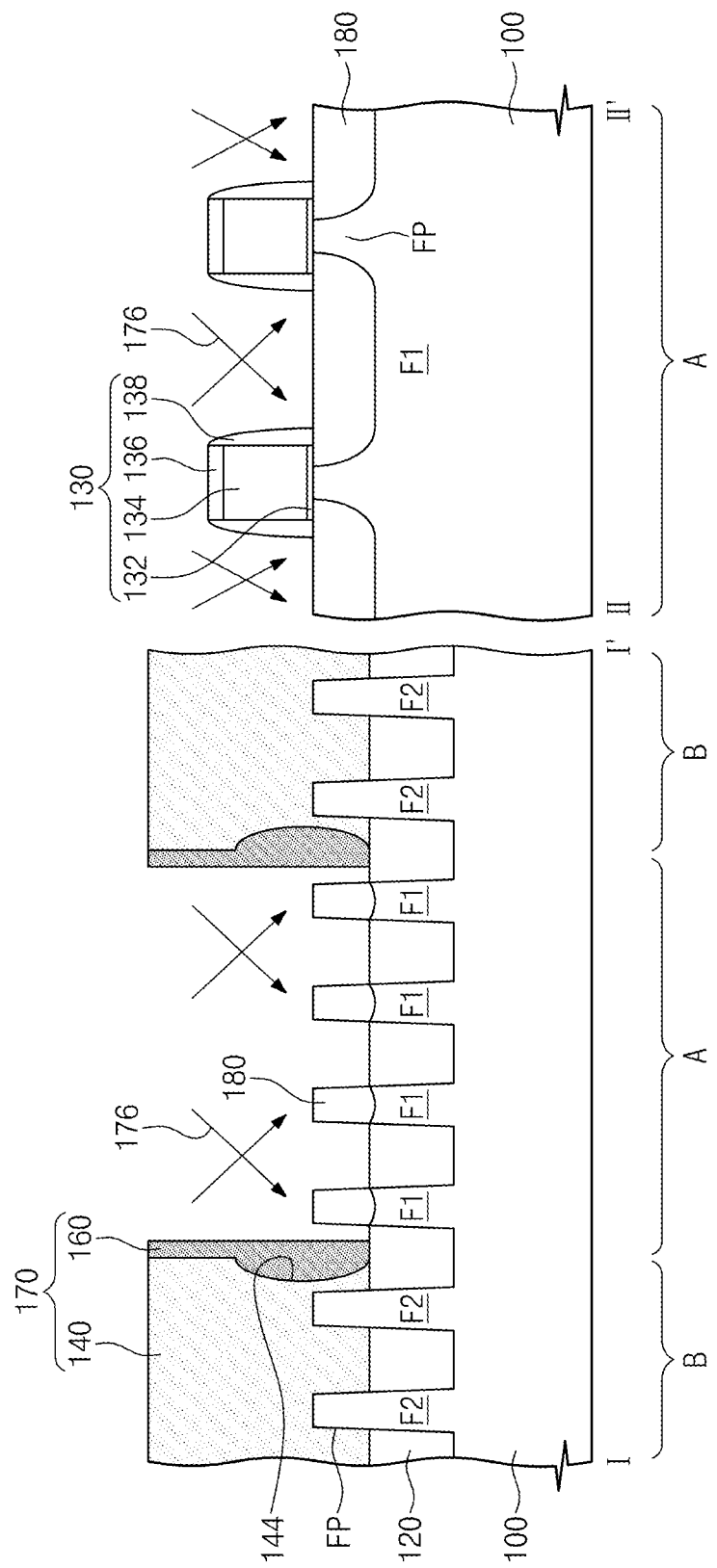

Referring to FIGS. 1, 4A, and 4E, ions serving as impurity may be injected into the first fins F1 on the first region A to form first impurity layers 180 (in S150).

The formation of the first impurity layers 180 may include a first ion implantation process 176 performed on the first fins F1 of the first region A using the first ion injection mask 170, and thus, the first impurity layers 180 having the second conductivity type may be formed in the first fins F1, respectively. In the first ion implantation process 176, impurity ions of the second conductivity type may be slantingly injected into the first fins F1 at a tilt angle of about 10° to 40°. In the first ion implantation process 176, n-type dopants (e.g., As or P) may be injected into the first fins F1 adjacent to the gate structures 130 at an injection energy ranging from about 20 KeV to about 50 KeV and at a dose ranging from about $1\times10^{10}$ ions/cm$^2$ to about $1\times10^{15}$ ions/cm$^2$. As a result, as described above, the first impurity layers 180 may be formed in the first fins F1, respectively. The first impurity layers 180 may be formed to serve as halo regions. The first impurity layers 180 may be formed to suppress a short channel effect from occurring in the semiconductor devices of the first conductivity type, which will be formed on the first fins F1. The first impurity layers 180 may be formed adjacent to both sides of each of the gate structures 130. Further, the first impurity layers 180 may extend below side edges of the gate structures 130. After the formation of the first impurity layers 180, the first ion injection mask 170 may be removed by an ashing process.

Figure 5B:
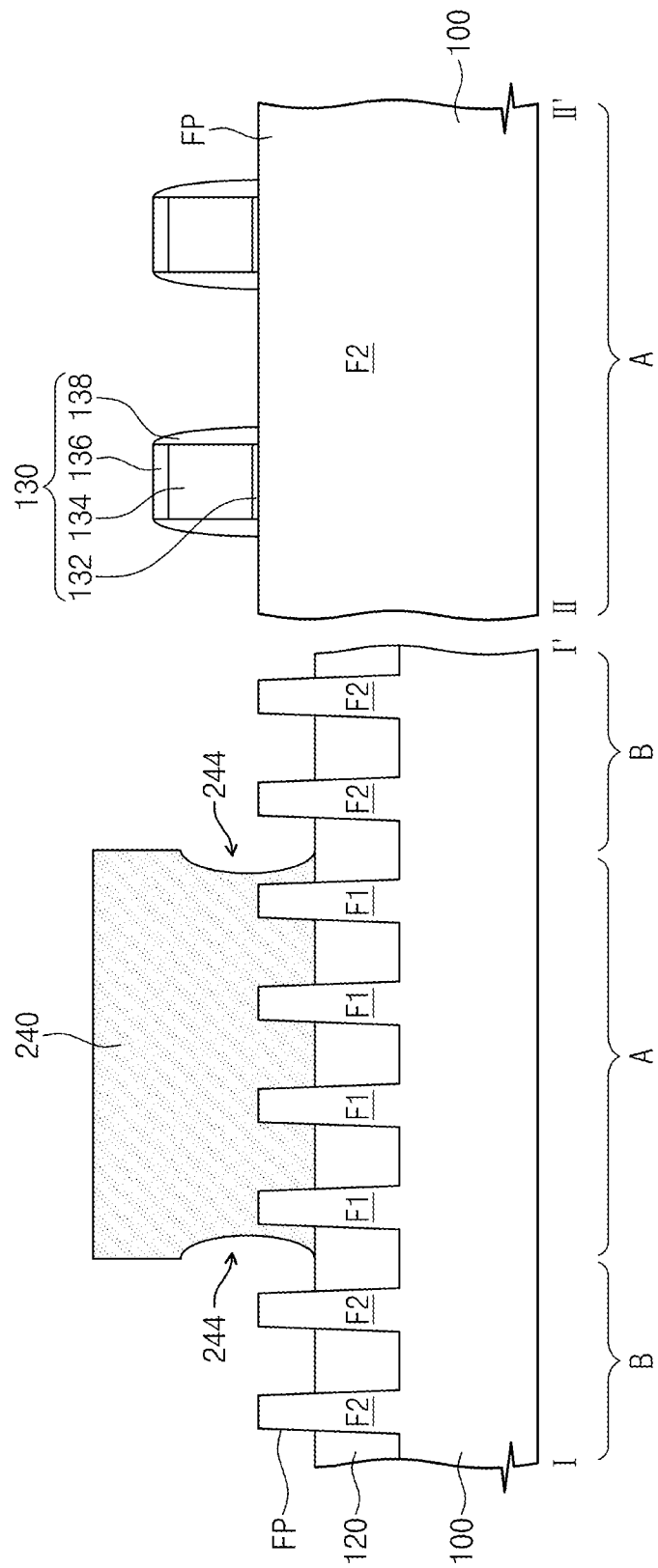

Referring to FIGS. 1, 5A, and 5B, a second photoresist pattern 240 may be formed to expose the second region B of the substrate 100 (in S160).

The second photoresist pattern 240 may be formed to cover the first region A of the substrate 100 and expose the second fins F2 formed on the second region B and the gate structures 130 crossing the second fins F2 and the insulating isolation layer 120. The formation of the second photoresist pattern 240 may include forming a photoresist layer to cover the whole top surface of the substrate 100 provided with the gate structures 130, exposing a portion of the photoresist layer positioned on the second region B to light, and then, developing the exposed photoresist layer. During the formation of the second photoresist pattern 240, an acid may be produced on a side surface of the second photoresist pattern 240.

The second photoresist pattern 240 may be formed of or include the same material as the first photoresist pattern 140 described with reference to FIG. 4B. The exposing of the photoresist layer for forming the second photoresist pattern 240 may be performed using KrF excimer laser, ArF excimer laser, extreme ultra violet (EUV) light, X-ray, or ion beam.

When the exposing process is performed on the portion of the photoresist layer on the second region B, light used in the exposing process may be scatteredly reflected by the second fins F2 on the substrate 100. As a result of the scattered reflection, a second undercut region 244 may be formed on a lower side surface of the second photoresist pattern 240. In this case, the first fins F1 of the first region A adjacent to the second undercut region 244 may be unintentionally doped with impurities, when the second fins F2 of the second region B are doped by an ion implantation process using the second photoresist pattern 240 as a mask. The unintended doping of the first fins F1 may lead to deterioration in electric characteristics or reliability of a semiconductor device (e.g., of the first conductivity type), which will be formed on the first fins F1 of the first region A.

Figure 5C:
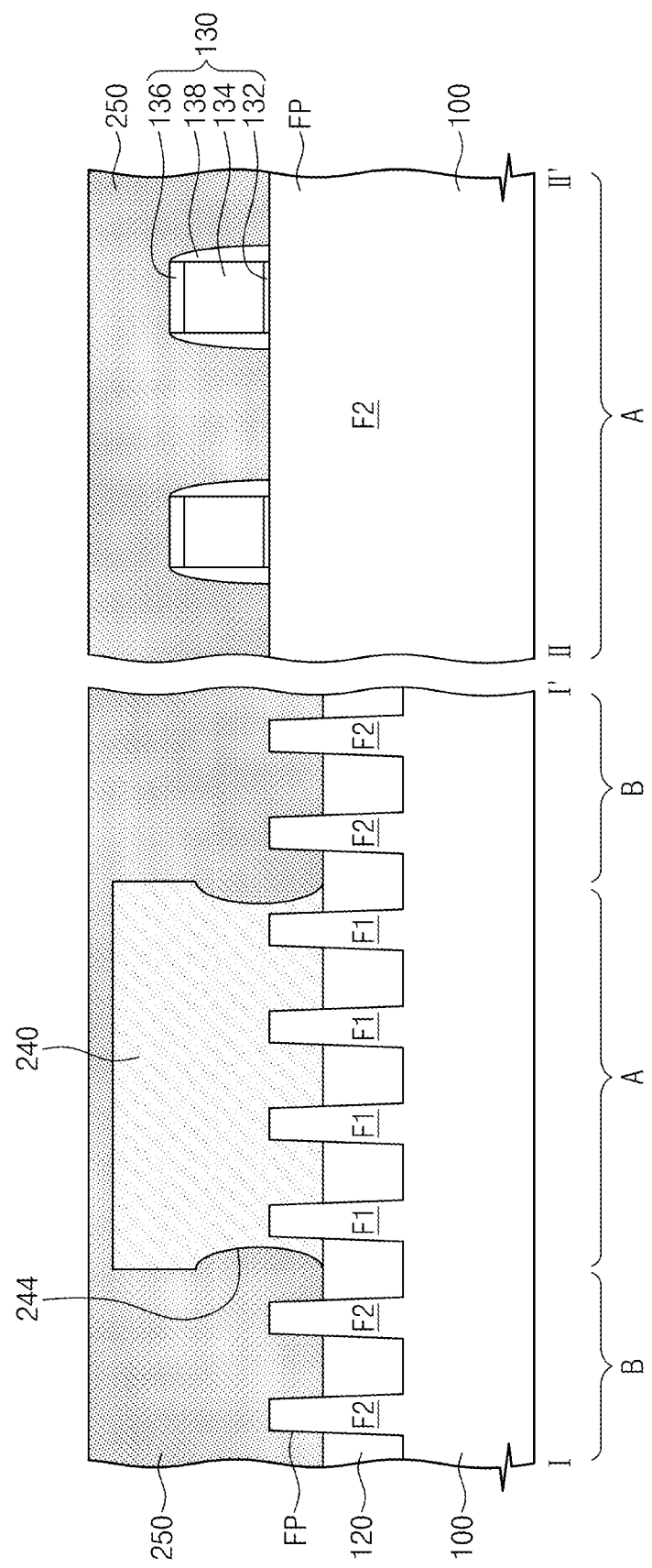

Referring to FIGS. 1, 5A, and 5C, a second material layer 250 may be formed to cover the second region B of the substrate 100 and the second photoresist pattern 240 (in S170).

The second material layer 250 may be formed on the second photoresist pattern 240 with the second undercut region 244 and the substrate 100 exposed by the second photoresist pattern 240. The second material layer 250 may cover the second fins F2, the gate structures 130, the insulating isolation layer 120, and the second photoresist pattern 240. The second material layer 250 may be formed using a spin coating process. In example embodiments, the second material layer 250 may be formed of a material containing a water-soluble polymer and a water-soluble crosslinking agent.

Figure 5D:
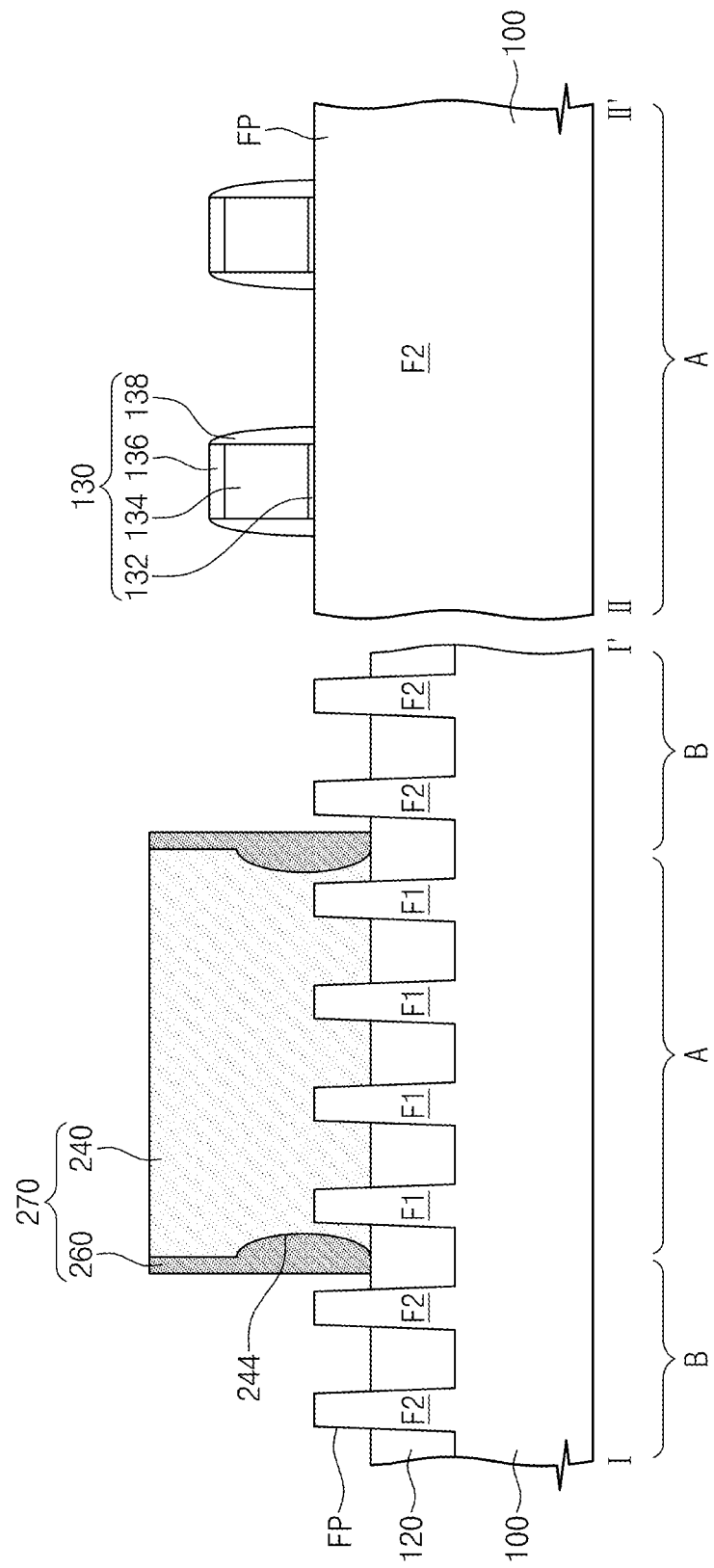

Referring to FIGS. 1, 5A, and 5D, a second supplemental film 260 may be formed on the side surface of the second photoresist pattern 240 (in S180).

The second material layer 250 and the second photoresist pattern 240 may be thermally treated by a baking process, which may be performed at temperature ranging from about 100° C. to about 150° C. During the baking process, a chemical reaction, such as inter-mixing or cross linking, may occur between the second photoresist pattern 240 and the second material layer 250 in contact with each other, and as a result of the chemical reaction, the second supplemental film 260 may be formed on the side surface of the second photoresist pattern 240. For example, the second supplemental film 260 may be produced by a chemical reaction between the acid and the water-soluble crosslinking agent containing material contained in the second photoresist pattern 240 and the second material layer 250, respectively. The side surface of the second photoresist pattern 240 with the second undercut region 244 may have a relatively large area, and thus, a large amount of the acid therein may be used for the chemical reaction with the water-soluble crosslinking agent containing material of the second material layer 250. Accordingly, the second supplemental film 260 may be formed to be thicker on the second undercut region 244 than on an upper side surface of the second photoresist pattern 240, and this makes it possible to improve uniformity of a sidewall profile of the second photoresist pattern 240. For example, the second supplemental film 260 may be formed to fill at least a portion of the second undercut region 244. Further, an outer side surface of the second supplemental film 260 facing the second region B may be formed to have a substantially uniform sidewall profile. A thickness of the second supplemental film 260 may be controlled by adjusting a process temperature and/or a duration time of the baking process.

A portion of the second material layer 250 may not be transformed to the second supplemental film 260 and may be in an unreacted state. Such an unreacted portion of the second material layer 250 may be removed by, for example, a rinse process using deionized water. The second photoresist pattern 240 and the second supplemental film 260 may constitute a second ion injection mask 270 exposing the second region B of the substrate 100. For example, the second ion injection mask 270 may expose the second fins F2, the insulating isolation layer 120, and the gate structures 130 on the second region B.

Figure 5E:
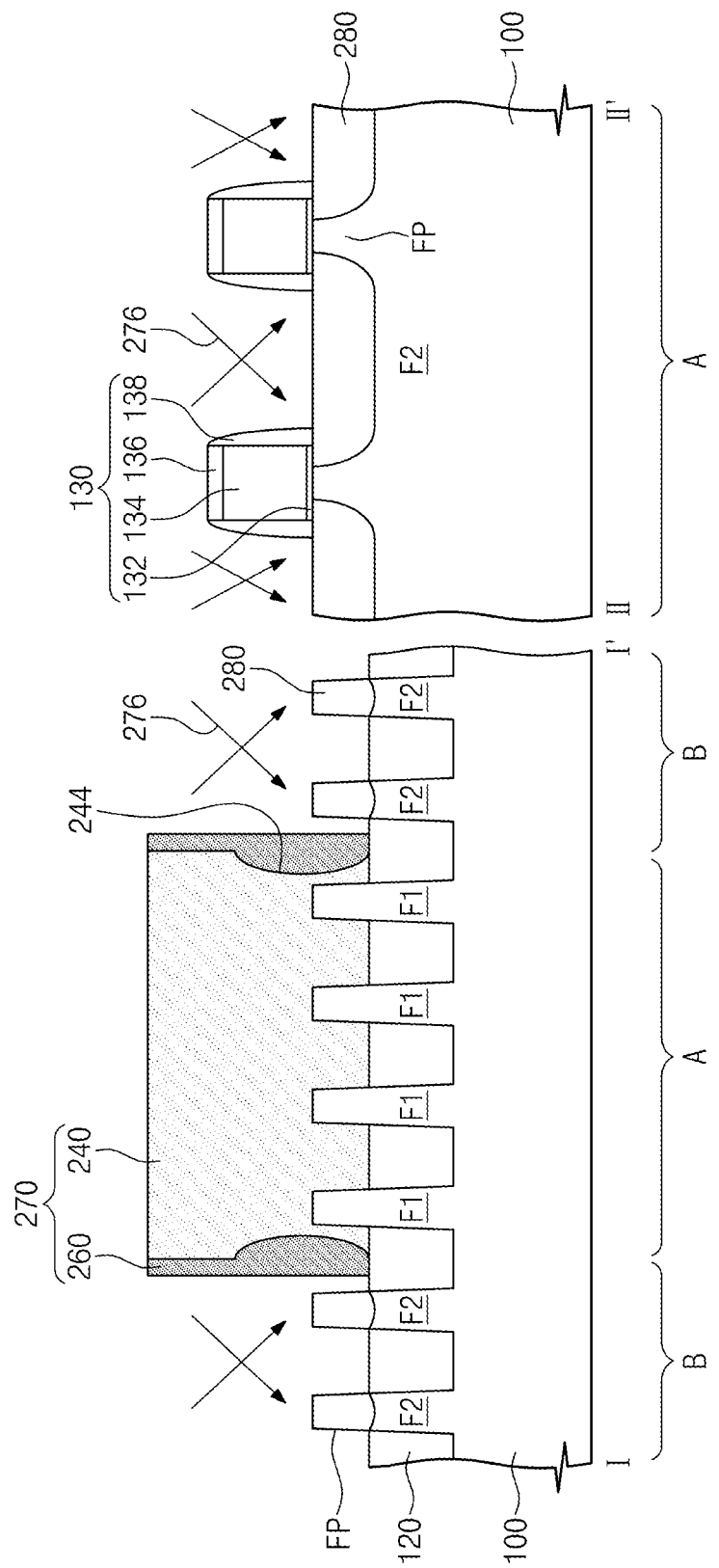

Referring to FIGS. 1, 5A, and 5E, ions serving as impurity may be injected into the second fins F2 on the second region B to form second impurity layers 280 (in S190).

The formation of the second impurity layers 280 may include a second ion implantation process 276 performed on the second fins F2 of the second region B, and thus, the second impurity layers 280 may be formed in the second fins F2, respectively. In the second ion implantation process 276, impurity ions of the first conductivity type may be slantingly injected into the second fins F2 at a tilt angle of about 10° to 40° using the second ion injection mask 270 as an ion mask. In the second ion implantation process 276, p-type dopants (e.g., BF$_2$ or B) may be injected into the second fins F2 at an energy ranging from about 10 KeV to about 40 KeV and at a dose ranging from about $1\times10^{10}$ ions/cm$^2$ to about $1\times10^{15}$ ions/cm$^2$. As a result, as described above, the second impurity layers 280 may be formed in the second fins F2, respectively. The second impurity layers 280 may be formed to serve as halo regions. The second impurity layers 280 may be formed to suppress a short channel effect from occurring in the semiconductor devices of the second conductivity type, which will be formed on the second fins F2. The second impurity layers 280 may be formed adjacent to both sides of each of the gate structures 130. Further, the second impurity layers 280 may extend below side edges of the gate structures 130. After the formation of the second impurity layers 280, the second ion injection mask 270 may be removed by an ashing process.

Figure 6:
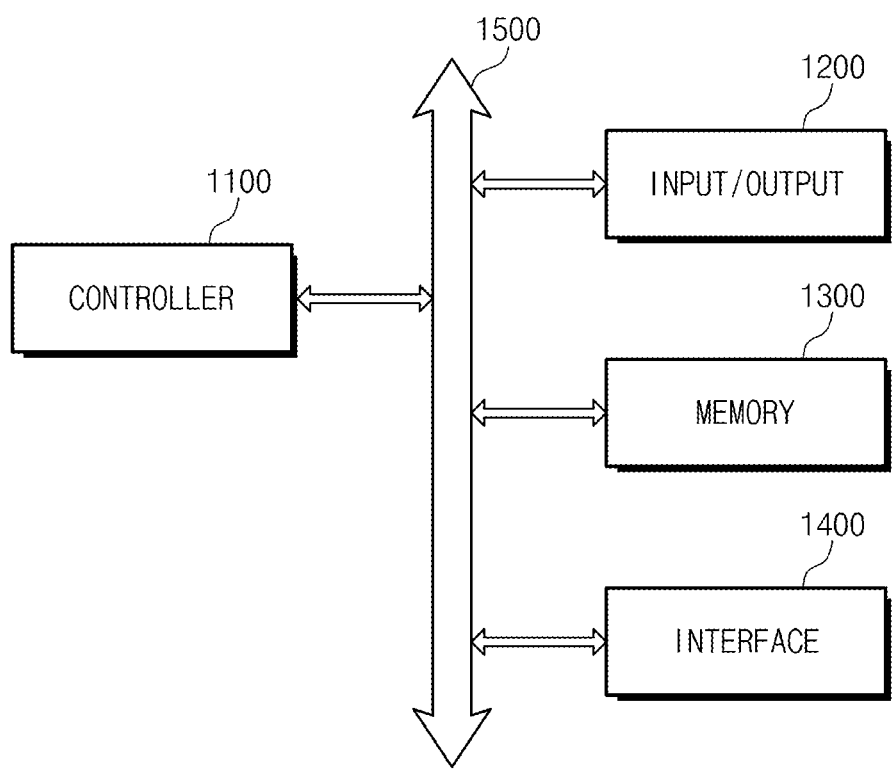
FIG. 6 is a block diagram schematically illustrating an example of electronic systems including a semiconductor device according to some example embodiments of the inventive concepts.

FIG. 6 is a block diagram schematically illustrating an example of electronic systems including a semiconductor device according to some example embodiments of the inventive concepts.

Referring to FIG. 6, an electronic system 1000 according to some example embodiments of the inventive concepts may include a controller 1100, an input/output (I/O) unit 1200, a memory device 1300, an interface unit 1400, and a data bus 1500. At least two of the controller 1100, the I/O unit 1200, the memory device 1300 and the interface unit 1400 may communicate with each other through the data bus 1500. The data bus 1500 may correspond to a path through which electrical signals are transmitted.

The controller 1100 may include at least one of a microprocessor, a digital signal processor, a microcontroller, or a logic device. The logic device may be configured to have a similar function to any one of the microprocessor, the digital signal processor, and the microcontroller. The I/O unit 1200 may include a keypad, a keyboard, or a display unit. The memory device 1300 may store data and/or commands. The interface unit 1400 may transmit electrical data to a communication network or may receive electrical data from a communication network. The interface unit 1400 may operate in a wireless or wired manner. For example, the interface unit 1400 may include an antenna for wireless communication or a transceiver for wired communication. Although not shown in the drawings, the electronic system 1000 may further include a fast DRAM device and/or a fast SRAM device that acts as a cache memory for improving an operation of the controller 1100. The semiconductor device according to some example embodiments of the inventive concepts may be provided in the memory device 1300, as a part of the controller 1100 or the I/O unit 1200.

The electronic system 1000 may be applied to a personal digital assistant (PDA), a portable computer, a web tablet, a wireless phone, a mobile phone, a digital music player, a memory card or an electronic product. The electronic product may receive or transmit information data by wireless.

A method of fabricating a semiconductor device may include a step of forming impurity layers in fins located at a specific region. The impurity layers may include formed using a photoresist pattern as an ion injection mask. According to some example embodiments of the inventive concepts, the photoresist pattern is formed to have an improved sidewall profile and thus, the use of the photoresist pattern makes it possible to prevent a process failure from occurring in an ion implantation process. As a result, it is possible to improve electric characteristics (e.g., reliability) of semiconductor devices formed on the fins.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
   providing a substrate with a first region and a second region;
   forming a photoresist pattern on the substrate to expose the first region of the substrate, the photoresist pattern formed to have an undercut region on a lower portion of a side surface of the photoresist pattern,
   forming a material layer on the substrate to cover the photoresist pattern and the first region of the substrate;
   forming a supplemental film on the side surface of the photoresist pattern to fill the undercut region, the supplemental film being formed by a chemical reaction between the photoresist pattern and the material layer; and
   injecting impurity ions into the first region of the substrate using the photoresist pattern and the supplemental film as an ion injection mask to form impurity layers in the substrate.

2. The method of claim 1, wherein the material layer is formed of a material containing a water-soluble polymer and a water-soluble crosslinking agent.

3. The method of claim 2, wherein the forming of the supplemental film comprises:
   chemically reacting the photoresist pattern with a portion of the material layer in contact with the side surface of the photoresist pattern to form the supplemental film; and
   removing an unreacted portion of the material layer to expose the first region of the substrate.

4. The method of claim 3, wherein the supplemental film is formed by performing a baking process on the photoresist pattern and the material layer at temperature ranging from about 100° C. to about 150° C.

5. The method of claim 3, wherein the supplemental film is formed to be thicker on the undercut region than on an upper side surface of the photoresist pattern.

6. The method of claim 5, further comprising:
   forming first and second fins on the first and second regions, respectively, of the substrate.

7. The method of claim 6, further comprising:
   forming gate structures to cross the first and second fins.

8. The method of claim 7, wherein the forming of the impurity layers comprises injecting impurity ions into the first fins of the first region to form first impurity layers, which are positioned adjacent to both sides of each of the gate structures to serve as halo regions.

9. A method of fabricating a semiconductor device, comprising:
   providing a substrate with fins;
   forming a photoresist pattern on the substrate, the photoresist pattern having an undercut region formed on a lower portion of a side surface;
   forming a material layer to cover the side surface and a top surface of the photoresist pattern;
   forming a supplemental film on the side surface of the photoresist pattern to fill at least a portion of the undercut region, the supplemental film being formed by chemically reacting the photoresist pattern with a portion of the material layer in contact with the side surface of the photoresist pattern; and
   injecting impurity ions into the fins using the photoresist pattern and the supplemental film as an ion injection mask to form impurity layers in the fins, respectively.

10. The method of claim 9, wherein the fins are formed to protrude upward from the substrate.

11. The method of claim 9, wherein the forming of the supplemental film further comprises:
   removing an unreacted portion of the material layer, after the forming of the supplemental film.

12. The method of claim 11, wherein the supplemental film is formed by performing a baking process on the photoresist pattern and the material layer at temperature ranging from about 100° C. to about 150° C.

13. The method of claim 9, wherein the impurity layers are formed to serve as halo regions.

14. A method of fabricating a semiconductor device, comprising:
providing a substrate with a first region and a second region;
forming first and second fins on the first and second regions, respectively, of the substrate;
forming a first photoresist pattern on the substrate to expose the first fins of the first region;
forming a first material layer on the substrate to cover the first photoresist pattern and the first fins of the first region;
chemically reacting the first photoresist pattern with a portion of the first material layer to form a first supplemental film on a side surface of the first photoresist pattern;
removing an unreacted portion of the first material layer;
injecting impurity ions into the first fins of the first region using the first supplemental film and the first photoresist pattern as a first ion injection mask pattern to form first impurity layers in the first fins, respectively;
removing the first ion injection mask;
forming a second photoresist pattern on the substrate to expose the second fins;
forming a second material layer on the substrate to cover the second photoresist pattern and the second fins of the second region;
chemically reacting the second photoresist pattern with a portion of the second material layer to form a second supplemental film on a side surface of the second photoresist pattern;
removing an unreacted portion of the second material layer; and
injecting impurity ions into the second fins of the second region using the second supplemental film and the second photoresist pattern as a second ion injection mask pattern to form second impurity layers in the second fins, respectively.

15. The method of claim 14, wherein each of the first and second photoresist patterns is formed to have an undercut region positioned on a lower portion of the side surface.

16. The method of claim 15, wherein the chemically reacting the first photoresist pattern with a portion of the first material layer occurs by performing a baking process on the first photoresist pattern and the first material layer at temperature ranging from about 100° C. to about 150° C., and wherein the chemically reacting the second photoresist pattern with a portion of the second material layer occurs by performing a baking process on the second photoresist pattern and the second material layer at temperature ranging from about 100° C. to about 150° C.

17. The method of claim 16, further comprising forming gate structures to cross the first and second fins.

18. The method of claim 17, wherein the first and second impurity layers are formed adjacent to both sides of each of the gate structures to serve as halo regions.

* * * * *